(12) United States Patent
Aoki et al.

(10) Patent No.: US 8,877,122 B2
(45) Date of Patent: Nov. 4, 2014

(54) NI-BASED SINGLE CRYSTAL SUPERALLOY AND TURBINE BLADE INCORPORATING THE SAME

(75) Inventors: Yasuhiro Aoki, Tokyo (JP); Nobuhito Sekine, Soma (JP); Akihiro Sato, New York, NY (US); Kazuhito Miyata, Tokyo (JP); Kazuyoshi Chikugo, Kawasaki (JP)

(73) Assignee: IHI Corporation (JP)

( * ) Notice: Subject to any disclaimer, the term of this patent is extended or adjusted under 35 U.S.C. 154(b) by 473 days.

(21) Appl. No.: 13/264,220

(22) PCT Filed: Apr. 16, 2010

(86) PCT No.: PCT/JP2010/002795
§ 371 (c)(1),
(2), (4) Date: Oct. 13, 2011

(87) PCT Pub. No.: WO2010/119709
PCT Pub. Date: Oct. 21, 2010

(65) Prior Publication Data
US 2012/0034098 A1 Feb. 9, 2012

(30) Foreign Application Priority Data
Apr. 17, 2009 (JP) ................................ P2009-100903

(51) Int. Cl.
*C22C 19/05* (2006.01)

(52) U.S. Cl.
USPC ........................................................ 420/444

(58) Field of Classification Search
USPC .......................................... 420/444; 148/410
See application file for complete search history.

(56) References Cited

U.S. PATENT DOCUMENTS

| | | | |
|---|---|---|---|
| 4,582,548 A | 4/1986 | Harris et al. | 148/404 |
| 4,643,782 A | 2/1987 | Harris et al. | 148/404 |
| 5,366,695 A | 11/1994 | Erickson | 420/448 |

(Continued)

FOREIGN PATENT DOCUMENTS

| | | |
|---|---|---|
| EP | 0 971 041 A1 | 1/2000 |
| EP | 1 930 455 A1 | 6/2008 |

(Continued)

OTHER PUBLICATIONS

ASM International, Materials Park, Ohio, Properties and Selection: Nonferrous Alloys and Special Purpose Materials: "Rare Earth Metals", Oct. 1990, vol. 2, pp. 720-732.*

(Continued)

*Primary Examiner* — Jessee Roe
(74) *Attorney, Agent, or Firm* — Ostrolenk Faber LLP

(57) ABSTRACT

A Ni-based single crystal superalloy which has the following composition: Co: 0.0 wt % or more to 15.0 wt % or less, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities. As a result, the Ni-based single crystal superalloy which includes more than 8 wt % of Re in the composition ratio and has excellent specific creep strength and the turbine blade incorporating the Ni-based single crystal superalloy may be made.

11 Claims, 4 Drawing Sheets

(56) References Cited

U.S. PATENT DOCUMENTS

| | | | |
|---|---|---|---|
| 5,482,789 A | 1/1996 | O'Hara et al. | 428/652 |
| 6,966,956 B2 | 11/2005 | Koizumi et al. | 148/428 |
| 2006/0011271 A1 | 1/2006 | Kobayashi et al. | 148/410 |
| 2006/0057018 A1* | 3/2006 | Hobbs et al. | 420/444 |
| 2009/0196760 A1* | 8/2009 | Harada et al. | 416/241 R |
| 2010/0092302 A1 | 4/2010 | Sato et al. | 416/241 R |

FOREIGN PATENT DOCUMENTS

| | | | | |
|---|---|---|---|---|
| GB | 2 105 748 | * | 3/1983 | C22C 19/05 |
| JP | 10-195565 | | 7/1998 | |
| JP | 2005-97649 | | 4/2005 | |
| JP | 2008-266698 | | 11/2008 | |
| RU | 2153021 C1 | | 7/2000 | |
| RU | 2 297 466 C2 | | 4/2007 | |
| WO | WO 2008/111585 | | 9/2008 | |

OTHER PUBLICATIONS

International Search Report mailed Jul. 6, 2010 in corresponding PCT International Application No. PCT/JP2010/002795.

E.N. Kablov et al. "Designing of High-Rhenium Single Crystal Ni-Base Superalloy for Gas Turbine Blades," Superalloys 2008 (Russia), TMS (The Minerals, Metals and Materials Society), 2008, pp. 901-908.

N. Saunders et al., "Modelling the Material Properties and Behaviour of Ni-Based Superalloys," Superalloys 2004, TMS (The Minerals, Metals and Materials Society), 2004, pp. 849-858.

Office Action dated Oct. 28, 2013 issued in corresponding Chinese Patent Application No. 201080026976.6 with English translation.

Decision on Grant dated Dec. 25, 2012 issued in corresponding Russian Patent Application No. 2011146064 with English translation (14 pages).

Office Action dated Aug. 3, 2012 issued in corresponding Canadian Patent Application No. 2758867.

* cited by examiner

NI-BASED SINGLE CRYSTAL SUPERALLOY AND TURBINE BLADE INCORPORATING THE SAME

CROSS-REFERENCE TO RELATED APPLICATIONS

The present application is a 35 U.S.C. §§371 national phase conversion of PCT/JP2010/002795, filed Apr. 16, 2010, which claims priority of Japanese Patent Application No. 2009-100903, filed Apr. 17, 2009, the contents of which are incorporated herein by reference. The PCT International Application was published in the Japanese language.

TECHNICAL FIELD

The present invention relates to a Ni-based single crystal superalloy and a turbine blade incorporating the same.

BACKGROUND ART

Turbine blades (stator blades and rotor blades) of aircraft engines, industrial gas turbines and other systems are often operated in high-temperature environments for a prolonged time and thus are made of a Ni-based single crystal superalloy that has an excellent heat resistance. The Ni-based single crystal superalloy is produced in the following manner. Al is first added to base Ni to cause $Ni_3Al$ to precipitate for precipitation strengthening. High melting point metals, such as Cr, W and Ta, are then added to form an alloy which is formed as a single crystal. The Ni-based single crystal superalloy acquires a metal structure suitable for strengthening through solution heat treatment at a predetermined temperature and subsequent aging heat treatment. The superalloy is called a precipitation hardened alloy which has a crystal structure with a precipitation phase (i.e., $\gamma'$ phase) dispersed and precipitated in a matrix (i.e., $\gamma$ phase).

As the Ni-based single crystal superalloy, a first generation superalloy contains no Re at all, a second generation superalloy contains about 3 wt % of Re, and a third generation superalloy contains 5 wt % or more to 6 wt % or less of Re, have been developed. The superalloys of later generations acquire enhanced creep strength. For example, the first generation Ni-based single crystal superalloy is CMSX-2 (Cannon-Muskegon Corporation, refer to Patent Document 1), the second generation Ni-based single crystal superalloy is CMSX-4 (Cannon Muskegon Corporation, refer to Patent Document 2) and the third generation Ni-based single crystal superalloy is CMSX-10 (Cannon Muskegon Corporation, refer to Patent Document 3).

The purpose of the third generation Ni-based single crystal superalloy, CMSX-10, is to enhance creep strength in high-temperature environments as compared to the second generation Ni-based single crystal superalloy. The third generation Ni-based single crystal superalloy, however, has a high composition ratio of Re of 5 wt % or more, which exceeds the solid solubility limit with respect to the matrix ($\gamma$ phase) of Re. The excess Re may combine with other elements in high-temperature environments and as a result, a so-called TCP (topologically close packed) phase to may precipitate. A turbine blade incorporating the third generation Ni-based single crystal superalloy may acquire an increased amount of the TCP phase when operated for a prolonged time in high-temperature environments, which may impair creep strength.

In order to solve these problems, a Ni-based single crystal superalloy having higher strength in high-temperature environments has been developed. In such a superalloy, Ru for controlling the TCP phase is added and the composition ratios of other component elements are set to optimal ranges so as to provide the optimal lattice constant of the matrix ($\gamma$ phase) and the optimal lattice constant of the precipitate ($\gamma'$ phase).

Namely, a fourth generation Ni-based single crystal superalloy which contains about 3 wt % of Ru and a fifth generation Ni-based single crystal superalloy which contains 4 wt % or more of Ru have been developed. The superalloys of later generations acquire enhanced creep strength. For example, an exemplary fourth generation Ni-based single crystal superalloy is TMS-138 (National Institute for Materials Science (NIMS) and IHI Corporation, refer to Patent Document 4), and an exemplary fifth generation Ni-based single crystal superalloy is TMS-162 (NIMS and IHI Corporation, refer to Patent Document 5).

The fourth and fifth generation Ni-based single crystal superalloys, however, include a large amount of heavy metal such as W and Re, in order to enhance the creep strength in high-temperature environments, and thus have a high specific gravity as compared to the first and second generation Ni-based single crystal superalloys. As a result, a turbine blade incorporating the fourth or fifth generation Ni-based single crystal superalloy is excellent in strength in high-temperature environments, however, since the weight of the blade is increased, there are problems that the circumferential speed of the turbine blade may be decreased and the weight of the aircraft engine and the industrial gas turbine may be increased.

In order to solve these problems, a Ni-based single crystal superalloy which has a low specific gravity as compared to the fourth and fifth generation Ni-based single crystal superalloys although its creep strength is high in high-temperature environments has been developed by specifying a composition range of W to optimal ranges suitable for keeping excellent creep strength in high-temperature environments and by specifying a composition range suitable for structural stability, with reducing an amount of W which has a high specific gravity (refer to Patent Document 6).

Furthermore, in recent years, a Ni-based single crystal superalloy which has a high composition ratio of Re as compared to the above-described conventional Ni-based single crystal superalloys (the composition ratio of Re is more than 8 wt % in the concrete) has been developed (refer to Non-Patent Document 1). This Ni-based single crystal superalloy is called as a high-rhenium single crystal Ni-base superalloy in the Non-Patent Document 1 and includes 9 wt % of Re in the composition ratio as shown in Table 1 of the Non-Patent Document 1.

PATENT DOCUMENTS

Patent Document 1: U.S. Pat. No. 4,582,548
Patent Document 2: U.S. Pat. No. 4,643,782
Patent Document 3: U.S. Pat. No. 5,366,695
Patent Document 4: U.S. Pat. No. 6,966,956
Patent Document 5: U.S. Patent Application, Publication No. 2006/0011271
Patent Document 6: International Patent Application, Publication No. WO2008/111585

Non-Patent Document

Non-Patent Document 1: E. N. Kablov, N. V. Petrushin, "DESIGNING OF HIGH-RHENIUM SINGLE CRYSTAL NI-BASE SUPERALLOY FOR GAS TURBINE BLADES", in Superalloys 2008 (Russia), Publ. of TMS (The Minerals, Metals & Materials Society), 2008, pp. 901-908

DISCLOSURE OF INVENTION

Problem that the Invention is to Solve

In order to develop a Ni-based single crystal superalloy which can obtain excellent creep strength in high-temperature environments as compared to the conventional alloys, it is expected that the composition ratio of Re in the alloy must be increased as described in the Non-Patent Document 1. Therefore, it is desirable to develop a Ni-based single crystal superalloy which has a composition ratio of Re higher than the conventional ratio of 8 wt % in order to improve creep strength of a turbine blade in high-temperature environments.

In addition, since this Ni-based single crystal superalloy includes a large amount of Re which is a heavy metal as compared to the conventional alloys, it is also desirable to develop a Ni-based single crystal superalloy having excellent creep strength per unit weight, i.e., having excellent specific creep strength, in order to provide a turbine blade which is lightweight and is operated at higher temperatures.

In view of these circumstances, an object of the present invention is to provide a Ni-based single crystal superalloy which includes a large amount of Re and has excellent specific creep strength and a turbine blade incorporating the same.

Means for Solving the Problem

The inventors have made intensive studies and found that a Ni-based single crystal superalloy which includes Re more than the conventional alloy and creep strength in high-temperature environments is improved, and which has a low specific gravity as compared to the fourth and fifth generation Ni-based single crystal superalloys may be obtained, by (1) modifying a composition ratio in view of structural stability and control of the TCP phase together with increasing the composition ratio of Re is more than 8 wt %, and (2) specifying a composition range suitable for maintaining excellent creep strength in high-temperature environments together with including Re which controls the TCP phase and with reducing an amount of W which has a high specific gravity; and completed the present invention.

That is, the present invention has the following aspects.
(1) A Ni-based single crystal superalloy which has the following composition: Co: 0.0 wt % or more to 15.0 wt % or less, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.
(2) A Ni-based single crystal superalloy which has the following composition: Co: 0.0 to 15.0 wt %, Cr: 5.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.
(3) A Ni-based single crystal superalloy which has the following composition: Co: 4.0 to 9.5 wt %, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.
(4) A Ni-based single crystal superalloy which has the following composition: Co: 4.0 to 9.5 wt %, Cr: 5.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.
(5) A Ni-based single crystal superalloy which has the following composition: Co: 0.0 to 15.0 wt %, Cr: 4.1 to 8.0 wt %, Mo: 2.1 to 4.5 wt %, W: 0.0 to 2.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.
(6) A Ni-based single crystal superalloy which has the following composition: Co: 0.0 to 15.0 wt %, Cr: 4.1 to 8.0 wt %, Mo: 2.1 to 4.5 wt %, W: 0.0 to 1.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.
(7) A Ni-based single crystal superalloy which has the following composition: Co: 4.0 to 9.5 wt %, Cr: 5.1 to 8.0 wt %, Mo: 2.1 to 4.5 wt %, W: 0.0 to 1.9 wt %, Ta: 4.0 to 6.5 wt %, Al: 4.5 to 6.5 wt %, Ti: 0.0 to 0.5 wt %, Hf: 0.00 to 0.5 wt %, Nb: 0.0 to 1.0 wt %, Re: 8.1 to 9.9 wt % and Ru: 4.0 to 6.5 wt % with the remainder including Ni and unavoidable impurities.
(8) A Ni-based single crystal superalloy which has the following composition: Co: 4.0 to 9.5 wt %, Cr: 5.1 to 6.5 wt %, Mo: 2.1 to 4.0 wt %, W: 0.0 to 1.9 wt %, Ta: 4.0 to 6.0 wt %, Al: 5.0 to 6.0 wt %, Ti: 0.0 to 0.5 wt %, Hf: 0.00 to 0.5 wt %, Nb: 0.0 to 1.0 wt %, Re: 8.1 to 9.0 wt % and Ru: 4.0 to 6.5 wt % with the remainder including Ni and unavoidable impurities.
(9) A Ni-based single crystal superalloy according to any one of above (1) to (8), further including at least one element selected from a group consisting of B, C, Si, Y, La, Ce, V and Zr.
(10) A Ni-based single crystal superalloy according to above (9), wherein the selected components are contained in the following composition: B: 0.05 wt % or less, C: 0.15 wt % or less, Si: 0.1 wt % or less, Y: 0.1 wt % or less, La: 0.1 wt % or less, Ce: 0.1 wt % or less, V: 1 wt % or less and Zr: 0.1 wt % or less.
(11) A turbine blade which incorporates the Ni-based single crystal superalloy according to any one of above (1) to (10).

Effects of the Invention

As described above, according to the present invention, an excellent creep strength in high-temperature environments can be maintained without increasing the specific gravity of the Ni-based single crystal superalloy which includes more than 8 wt % of Re in the composition ratio. Therefore, the turbine blade incorporating the Ni-based single crystal superalloy can be made lightweight and can be operated at higher temperatures.

DESCRIPTION OF THE PREFERRED EMBODIMENTS

Figure 1:
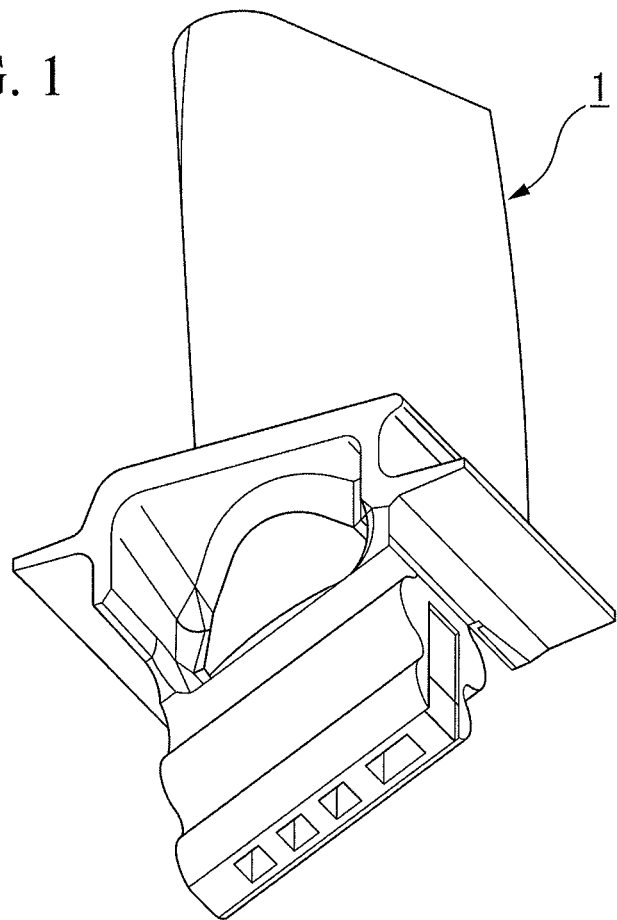
FIG. 1 is a perspective view of an exemplary turbine blade incorporating a Ni-based single crystal superalloy according to an embodiment of the present invention.

In the following, a detailed explanation for carrying out a Ni-based single crystal superalloy and a turbine blade incorporating the same according to the present invention will be explained in detail with reference to the drawings.

A single crystal Ni-based superalloy according to the present invention has the following composition: Co: 0.0 wt % or more to 15.0 wt % or less, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.

A single crystal Ni-based superalloy according to the present invention also has the following composition: Co: 0.0 to 15.0 wt %, Cr: 5.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.

A single crystal Ni-based superalloy according to the present invention also has the following composition: Co: 4.0 to 9.5 wt %, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.

A single crystal Ni-based superalloy according to the present invention also has the following composition: Co: 4.0 to 9.5 wt %, Cr: 5.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.

A Ni-based single crystal superalloy according to the present invention also has the following composition: Co: 0.0 to 15.0 wt %, Cr: 4.1 to 8.0 wt %, Mo: 2.1 to 4.5 wt %, W: 0.0 to 2.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.

A Ni-based single crystal superalloy according to the present invention also has the following composition: Co: 0.0 to 15.0 wt %, Cr: 4.1 to 8.0 wt %, Mo: 2.1 to 4.5 wt %, W: 0.0 to 1.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 8.1 to 9.9 wt % and Ru: 0.5 to 6.5 wt % with the remainder including Ni and unavoidable impurities.

A Ni-based single crystal superalloy according to the present invention also has the following composition: Co: 4.0 to 9.5 wt %, Cr: 5.1 to 8.0 wt %, Mo: 2.1 to 4.5 wt %, W: 0.0 to 1.9 wt %, Ta: 4.0 to 6.5 wt %, Al: 4.5 to 6.5 wt %, Ti: 0.0 to 0.5 wt %, Hf: 0.00 to 0.5 wt %, Nb: 0.0 to 1.0 wt %, Re: 8.1 to 9.9 wt % and Ru: 4.0 to 6.5 wt % with the remainder including Ni and unavoidable impurities.

A Ni-based single crystal superalloy according to the present invention also has the following composition: Co: 4.0 to 9.5 wt %, Cr: 5.1 to 6.5 wt %, Mo: 2.1 to 4.0 wt %, W: 0.0 to 1.9 wt %, Ta: 4.0 to 6.0 wt %, Al: 5.0 to 6.0 wt %, Ti: 0.0 to 0.5 wt %, Hf: 0.00 to 0.5 wt %, Nb: 0.0 to 1.0 wt %, Re: 8.1 to 9.0 wt % and Ru: 4.0 to 6.5 wt % with the remainder including Ni and unavoidable impurities.

In the present invention, in order to obtain a Ni-based single crystal superalloy which having a low specific gravity, the content of W in the composition of the Ni-based single crystal superalloy may be 0.0 to 2.9 wt % and more preferably may be 0.0 to 1.9 wt %.

The metal structure of the above-described Ni-based single crystal superalloy is a crystal structure with the precipitation phase (γ' phase) dispersed and precipitated in the matrix (γ phase). The γ phase consists of an austenite phase and the γ' phase consists mainly of intermetallic compounds having an ordered structure, such as $Ni_3Al$. In the Ni-based single crystal superalloy according to the present invention, the composition ratio of the γ-phase and the γ'-phase dispersed in the γ-phase may be optimized to contribute to higher strength of the superalloy to be operated in high-temperature environments.

The composition ranges of the components of the Ni-based single crystal superalloy are controlled based on their characteristics described below.

Co is an element that increases the solid solubility limit to the matrix containing Al, Ta and other elements in high-temperature environments and causes the fine γ' phase to disperse and precipitate in heat treatment so as to enhance the high-temperature strength. If more than 15.0 wt % of Co exists, the composition ratio with other elements, including Al, Ta, Mo, W, Hf and Cr, becomes unbalanced. As a result, a harmful phase precipitates to decrease the high-temperature strength. The content of Co is preferably 0.0 to 15.0 wt %, and more preferably 4.0 to 9.5 wt %.

Cr is an element that has excellent oxidation resistance and improves, altogether with Hf and Al, high-temperature corrosion resistance of the Ni-based single crystal superalloy. If the content of Cr is less than 4.1 wt %, it is difficult to provide a desired high-temperature corrosion resistance. If the content of Cr exceeds 8.0 wt %, precipitation of the γ' phase is inhibited and harmful phases, such as σ phase and μ phase, may precipitate to decrease the high-temperature strength. The content of Cr is therefore preferably 4.1 to 8.0 wt %, more preferably 5.1 to 8.0 wt %, and more preferably 5.1 to 6.5 wt %.

Mo is an element that enhances the high-temperature strength by dissolving in the phase which becomes the matrix, in the presence of W or Ta, and also improves high-temperature strength due to precipitation hardening. If the content of Mo is less than 2.1 wt %, it is difficult to provide a desired high-temperature strength. If the content of Mo exceeds 4.5 wt %, the high-temperature strength decreases and the high-temperature corrosion resistance deteriorates. The content of Mo is therefore preferably 2.1 to 4.5 wt %, more preferably 2.1 to 3.4 wt %, and more preferably 2.1 to 3.0 wt %.

W is an element that enhances the high-temperature strength due to the actions of solution hardening and precipitation hardening in the presence of Mo or Ta. If the content of W exceeds 3.9 wt %, the high-temperature corrosion resistance deteriorates. The content of W is therefore preferably 0.0 to 3.9 wt %. In order to provide a Ni-based single crystal superalloy having a low specific gravity, the content of W is preferably 0.0 to 2.9 wt % and more preferably 0.0 to 1.9 wt %. In the present invention, with a small amount of W or no W at all, excellent creep strength in high-temperature environments may be kept by appropriately determining the composition ratio of other component elements.

Ta is an element that enhances the high-temperature strength due to the actions of solution hardening and precipitation hardening in the presence of Mo or W. Ta also enhances the high-temperature strength by the precipitation hardening relative to the γ' phase. If the content of Ta is less than 4.0 wt %, it is difficult to provide desired high-temperature strength. If the content of Ta exceeds 10.0 wt %, a harmful phase, such as σ phase and μ phase, may precipitate to decrease the high-temperature strength. The content of Ta is therefore preferably 4.0 to 10.0 wt %, more preferably 4.0 to 6.5 wt %, and more preferably 4.0 to 6.0 wt %.

Al combines with Ni to form a 60 to 70% (volume percentage) of an intermetallic compound represented by $Ni_3Al$, which is the fine γ' phase to be uniformly dispersed and precipitated into the matrix. That is, Al is an element that enhances the high-temperature strength altogether with Ni. Furthermore, Al is excellent in oxidation resistance, which improves, altogether with Cr and Hf, the high-temperature corrosion resistance of the Ni-based single crystal superalloy. If the content of Al is less than 4.5 wt %, the precipitation amount of the γ' phase is insufficient and it is thus difficult to provide desired high-temperature strength and high-temperature corrosion resistance. If the content of Al exceeds 6.5 wt %, a large amount of coarse eutectic γ' phase is formed and solution heat treatment cannot be performed, and makes difficult to provide desired high-temperature strength. Accordingly, the content of Al is preferably 4.5 to 6.5 wt % and more preferably 5.0 to 6.0 wt %.

Ti is an element that enhances the high-temperature strength due to the actions of solution hardening and precipitation hardening in the presence of Mo or W. Ti also enhances the high-temperature strength by the precipitation hardening with relative to the γ'-phase. If the content of Ti exceeds 1.0 wt %, a harmful phase, such as σ phase and μ phase, may precipitate to decrease the high-temperature strength. The content of Ti is therefore preferably 0.0 to 1.0 wt % and more preferably 0.0 to 0.5 wt %. In the present invention, with a small amount of Ti or no Ti at all, excellent creep strength in high-temperature environments may be kept by appropriately determining the composition ratio of other component elements.

Hf is an element that segregates at the grain boundary and distributed unevenly in grain boundary to strengthen the same so as to enhance the high-temperature strength when the grain boundary accidentally exists. Furthermore, Hf is excellent in oxidation resistance, and improves, altogether with Cr and Al, high-temperature corrosion resistance of the Ni-based single crystal superalloy. If the content of Hf exceeds 0.5 wt %, local melting occurs to decrease the high-temperature strength. The content of Hf is therefore preferably 0.00 to 0.5 wt %.

Nb is an element that enhances the high-temperature strength. However, if the content of Nb exceeds 3.0 wt %, a harmful phase precipitates to decrease the high-temperature strength. The content of Nb is therefore preferably 0.0 to 3.0 wt % and more preferably 0.0 to 1.0 wt %. With a small amount of Nb or no Nb at all, excellent creep strength in high-temperature environments may be kept by appropriately determining the composition ratio of other component elements.

Re is an element that enhances the high-temperature strength due to solution strengthening by dissolving in the γ phase which is the matrix. Re also enhances the corrosion resistance. However, if the content of Re is less than 3.0 wt %, solution strengthening of the γ phase becomes insufficient, which makes it difficult to provide desired high-temperature strength. Here, the present invention is performed for the Ni-based single crystal superalloy which includes more Re compared to the conventional alloy, and therefore, the lower limit of the composition ratio of Re is set to 8.1 wt %.

If the content of Re exceeds 9.9 wt %, the harmful TCP phase precipitates in high-temperature environments, which makes it difficult to provide desired high-temperature strength. The content of Re is therefore preferably 8.1 to 9.9 wt % and more preferably 8.1 to 9.0 wt %.

Ru is an element that controls precipitation of the TCP phase to enhance the high-temperature strength. However, if the content of Ru is less than 0.5 wt %, the TCP phase precipitates in high-temperature environments, which makes it difficult to provide desired high-temperature strength. If the content of Ru exceeds 6.5 wt %, a harmful phase precipitates to decrease the high-temperature strength. The content of Ru is therefore preferably 0.5 to 6.5 wt % and more preferably 4.0 to 6.5 wt %.

The Ni-based single crystal superalloy of the present invention may further contain for example B, C, Si, Y, La, Ce, V and Zr and the like, other than incidental impurities. When the Ni-based single crystal superalloy contains at least one element selected from B, C, Si, Y, La, Ce, V and Zr, it is preferable that these elements may be included in the following composition range so as to prevent precipitation of the harmful phase which might otherwise decrease the high-temperature strength: B: 0.05 wt % or less, C: 0.15 wt % or less, Si: 0.1 wt % or less, Y: 0.1 wt % or less, La: 0.1 wt % or less, Ce: 0.1 wt % or less, V: 1 wt % or less and Zr: 0.1 wt % or less.

On the other hand, Si has an effect which lowers a melting point of the alloy and may exerts a harmful influence such as local dissolution of the materials during heat treatment in high-temperature environments such as solution heat treatment. Therefore, in the Ni-based single crystal superalloy according to the present invention, it is undesirable to include elements such as Si and contents of such elements should be decreased in so far as it is possible.

As described above, the Ni-based single crystal superalloy according to the present invention may maintain an excellent creep strength in high-temperature environments without increasing the specific gravity whereas it includes a large amount of Re. In the concrete, even if the content of W is as small as 2.9 wt % or less, or even as small as 1.9 wt % or less, in order to provide a Ni-based single crystal superalloy having a low specific gravity, excellent creep strength may be kept in high-temperature environments. Therefore, the Ni-based single crystal superalloy according to the present invention exhibits excellent creep strength (i.e., excellent specific creep strength) per unit density.

The Ni-based single crystal superalloy according to the present invention may be used in, for example, a turbine blade 1 as shown in FIG. 1. The turbine blade 1 incorporating the Ni-based single crystal superalloy according to the present invention has excellent creep strength in high-temperature environments and may operate for a prolonged time in high-temperature environments. In addition, the turbine blade 1 has a low specific gravity as compared to the fourth or fifth generation Ni-based single crystal superalloy. Accordingly, the turbine blade 1 may be made lightweight and may be operated at higher temperatures.

Therefore, the Ni-based single crystal superalloy according to the present invention may be incorporated in, for example, turbine blades (stator blades and rotor blades) of an aircraft engine, an industrial gas turbine and other systems. In addition, the Ni-based single crystal superalloy according to an embodiment of the present invention may also be applied to components or products to be operated for a long time in high-temperature environments.

In the present invention, the composition ratio of the γ phase and the γ' phase dispersed in the γ phase may be optimized. The invention may therefore be applied to, for example, an unidirectional solidified material and a normal casting material with similar advantageous effects of the present invention, in addition to the Ni-based single crystal superalloy.

Examples

Hereinafter, advantageous effects of the present invention will be described in more detail with reference to Examples. It is to be noted that the present invention is not limited to the Examples and various modification may be made without departing from the spirit and scope of the present invention.

First, molten metals of various kinds of Ni-based single crystal superalloys are prepared in a vacuum melting furnace. Alloy ingots of Examples 1 to 3 of varying compositions are cast from the prepared alloy molten metals. The composition ratios of the alloy ingots of Examples 1 to 3 are shown in Table 1. Table 1 also shows the composition ratios of related art Ni-based single crystal superalloys as Reference Examples 1 to 28.

Next, the alloy ingots shown in Table 1 are subject to solution heat treatment and aging heat treatment to provide the Ni-based single crystal superalloys of Examples 1 to 3. In the solution heat treatment, the temperature is raised stepwise from 1503K-1563K (1230° C.-1290° C.) to 1573K-1613K (1300° C.-1340° C.) and kept for 1 to 10 hours or longer. In the aging heat treatment, primary aging heat treatment is conducted where the ingots are kept at 1273K to 1423K (1000° C. to 1150° C.) for 3 to 5 hours.

For each of the Ni-based single crystal superalloys of Examples 1 to 3, the condition of the alloy structure is observed with a scanning electron microscope (SEM). The TCP phase is found in neither of the alloy microstructures.

Figure 2:
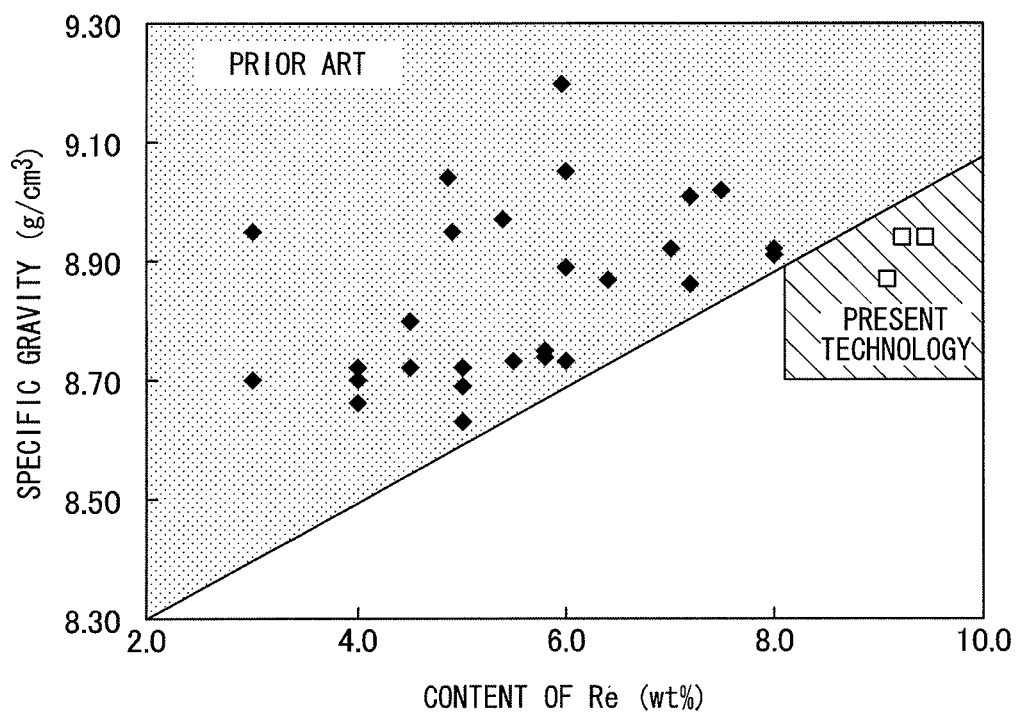
FIG. 2 is a characteristic chart showing a relationship between content of Re and specific gravity in examples and reference examples shown in Table 1.

Next, the difference of characteristics regarding Re contents and specific gravity between the present technology (Examples 1 to 3) and the prior art (Reference Examples 1 to 28) will be explained with reference to FIG. 2. In FIG. 2, plotted quadrates denote the Examples 1 to 3 and plotted rhombuses denote Reference Examples 1 to 28.

As shown in FIG. 2, the difference of characteristics between the present technology and the prior art is clearly denoted as a relationship between the Re contents and specific gravity. In the Ni-based single crystal superalloys of the prior art, the specific gravity tends to increase in accordance with an increase of the Re contents. However, in case of the present technology, an increment (gradient) of the specific gravity becomes smaller than an increment (gradient) of the specific gravity of the prior art.

That is, in the Ni-based single crystal superalloy which includes 8.0 wt % or more of Re which is a heavy metal in its composition ratio, the specific gravity is inevitably increases.

However, as shown in FIG. 2, in the present technology, the composition range of the alloy including Ru which controls TCP phase is specified to optimal ranges suitable for keeping excellent creep strength in high-temperature environments.

TABLE 1

| | | Composition (wt %) | | | | | | | | | | | Specific Gravity | Alloy | |
|---|---|---|---|---|---|---|---|---|---|---|---|---|---|---|---|
| | | Co | Cr | Mo | W | Al | Ti | Nb | Ta | Hf | Re | Ru | Ni | (g/cm3) | Generation | Note |
| Examples | 1 | 5.50 | 5.20 | 3.00 | 0.00 | 5.40 | 0.00 | 0.50 | 5.00 | 0.10 | 9.20 | 5.50 | 60.50 | 8.94 | | |
| | 2 | 5.50 | 6.30 | 2.20 | 0.00 | 5.60 | 0.00 | 0.50 | 5.00 | 0.10 | 9.50 | 5.50 | 59.80 | 8.94 | | |
| | 3 | 5.30 | 5.20 | 2.90 | 0.00 | 5.80 | 0.00 | 0.50 | 4.80 | 0.10 | 9.10 | 5.50 | 60.80 | 8.87 | | |
| Reference | 1 | 5.50 | 5.40 | 2.20 | 2.90 | 5.60 | 0.00 | 0.50 | 5.50 | 0.10 | 7.50 | 5.00 | 59.50 | 9.02 | 5 | |
| Examples | 2 | 6.00 | 5.50 | 4.80 | 1.50 | 5.40 | 0.00 | 0.50 | 5.80 | 0.10 | 6.00 | 5.00 | 59.40 | 8.89 | 5 | |
| | 3 | 6.00 | 5.40 | 5.00 | 0.00 | 5.50 | 0.00 | 0.50 | 6.20 | 0.10 | 6.40 | 5.00 | 59.90 | 8.87 | 5 | |
| | 4 | 5.80 | 5.40 | 4.80 | 0.00 | 5.70 | 0.00 | 0.70 | 6.00 | 0.10 | 5.80 | 3.60 | 62.10 | 8.75 | 4 | |
| | 5 | 5.80 | 5.80 | 3.80 | 1.60 | 5.90 | 0.00 | 0.50 | 6.00 | 0.10 | 5.00 | 2.00 | 63.50 | 8.72 | 4 | |
| | 6 | 5.80 | 5.80 | 4.50 | 0.00 | 6.00 | 0.00 | 0.50 | 6.20 | 0.10 | 5.00 | 2.00 | 64.10 | 8.63 | 4 | |
| | 7 | 5.80 | 5.80 | 4.00 | 1.80 | 6.00 | 0.00 | 0.00 | 7.00 | 0.10 | 4.00 | 1.50 | 64.00 | 8.70 | 4 | |
| | 8 | 5.80 | 5.80 | 4.50 | 0.00 | 6.00 | 0.00 | 0.00 | 8.00 | 0.10 | 4.00 | 1.50 | 64.30 | 8.66 | 4 | |
| | 9 | 5.80 | 6.00 | 3.40 | 2.90 | 6.00 | 0.00 | 0.00 | 6.40 | 0.10 | 4.00 | 1.50 | 63.90 | 8.72 | 4 | |
| | 10 | 7.00 | 6.00 | 4.00 | 2.00 | 5.80 | 0.00 | 0.50 | 6.50 | 0.10 | 4.50 | 1.00 | 62.60 | 8.72 | 4 | |
| | 11 | 5.80 | 5.40 | 3.60 | 1.60 | 5.60 | 0.00 | 0.50 | 5.90 | 0.10 | 7.00 | 5.00 | 59.50 | 8.92 | 5 | |
| | 12 | 5.80 | 6.00 | 4.00 | 0.00 | 5.50 | 0.00 | 0.50 | 6.20 | 0.10 | 7.20 | 5.00 | 59.70 | 8.86 | 5 | |
| | 13 | 7.00 | 7.00 | 6.50 | 0.00 | 4.80 | 0.00 | 3.00 | 4.00 | 0.10 | 4.50 | 6.00 | 57.10 | 8.80 | 5 | |
| | 14 | 5.80 | 5.50 | 3.00 | 0.00 | 5.50 | 0.00 | 0.00 | 9.00 | 0.10 | 7.20 | 5.00 | 58.90 | 9.01 | 5 | |
| | 15 | 5.50 | 5.60 | 3.20 | 1.90 | 5.60 | 0.00 | 0.80 | 4.10 | 0.10 | 8.00 | 5.50 | 59.70 | 8.91 | 5 | |
| | 16 | 5.50 | 5.60 | 3.20 | 1.90 | 5.60 | 0.00 | 0.50 | 4.50 | 0.10 | 8.00 | 5.50 | 59.60 | 8.92 | 5 | |
| | 17 | 8.00 | 5.80 | 3.80 | 1.60 | 5.90 | 0.00 | 0.50 | 6.00 | 0.10 | 5.00 | 1.00 | 62.30 | 8.69 | 4 | |
| | 18 | 9.00 | 5.40 | 3.60 | 1.60 | 5.90 | 0.00 | 0.70 | 5.50 | 0.10 | 5.80 | 2.00 | 60.40 | 8.74 | 4 | |
| | 19 | 5.80 | 5.10 | 3.00 | 1.90 | 6.10 | 0.00 | 0.50 | 5.00 | 0.10 | 6.00 | 3.00 | 63.50 | 8.73 | 4 | |
| | 20 | 5.80 | 5.10 | 2.50 | 2.90 | 6.00 | 0.00 | 0.00 | 4.80 | 0.10 | 5.50 | 2.50 | 64.80 | 8.73 | 4 | |
| | 21 | 5.88 | 2.94 | 2.94 | 5.88 | 5.88 | 0.00 | 0.00 | 5.88 | 0.10 | 4.90 | 2.00 | 63.60 | 8.95 | 4 | TMS-138 |
| | 22 | 5.82 | 2.91 | 3.88 | 5.82 | 5.82 | 0.00 | 0.00 | 5.82 | 0.10 | 4.90 | 6.00 | 58.98 | 9.04 | 5 | TMS-162 |
| | 23 | 10.00 | 5.00 | 2.00 | 6.00 | 5.60 | 0.00 | 0.00 | 9.00 | 0.10 | 3.00 | 0.00 | 59.30 | 8.95 | 2 | PWA1484 |
| | 24 | 9.60 | 6.40 | 0.60 | 6.40 | 5.60 | 1.00 | 0.00 | 6.50 | 0.10 | 3.00 | 0.00 | 60.80 | 8.70 | 2 | CMSX-4 |
| | 25 | 3.00 | 2.00 | 0.40 | 5.00 | 5.70 | 0.20 | 0.00 | 8.00 | 0.03 | 6.00 | 0.00 | 69.67 | 9.05 | 3 | CMSX-10 |
| | 26 | 16.50 | 2.00 | 2.00 | 6.00 | 5.55 | 0.00 | 0.00 | 8.25 | 0.15 | 6.00 | 3.00 | 50.60 | 9.20 | 4 | EPM-102 |
| | 27 | 8.00 | 7.00 | 2.00 | 5.00 | 6.20 | 0.00 | 0.00 | 7.00 | 0.20 | 3.00 | 0.00 | 61.60 | 8.70 | 2 | Rene' N5 |
| | 28 | 12.50 | 4.20 | 1.40 | 6.00 | 5.75 | 0.00 | 0.00 | 7.20 | 0.15 | 5.40 | 0.00 | 57.40 | 8.97 | 3 | Rene' N6 |

As a result, the Ni-based single crystal superalloy in which the increment of its specific gravity becomes smaller than that of the prior art which includes 8.0 wt % or more of Re is obtained whereas it includes 8.0 wt % or more of Re.

Next, the Ni-based single crystal superalloys of Examples 1 to 3 are subject to a creep test at the temperature of 1000° C. to 1050° C. and under the stress of 245 MPa. The test is continued until a creep rupture of the samples, and the duration time is defined as creep life.

Figure 3:
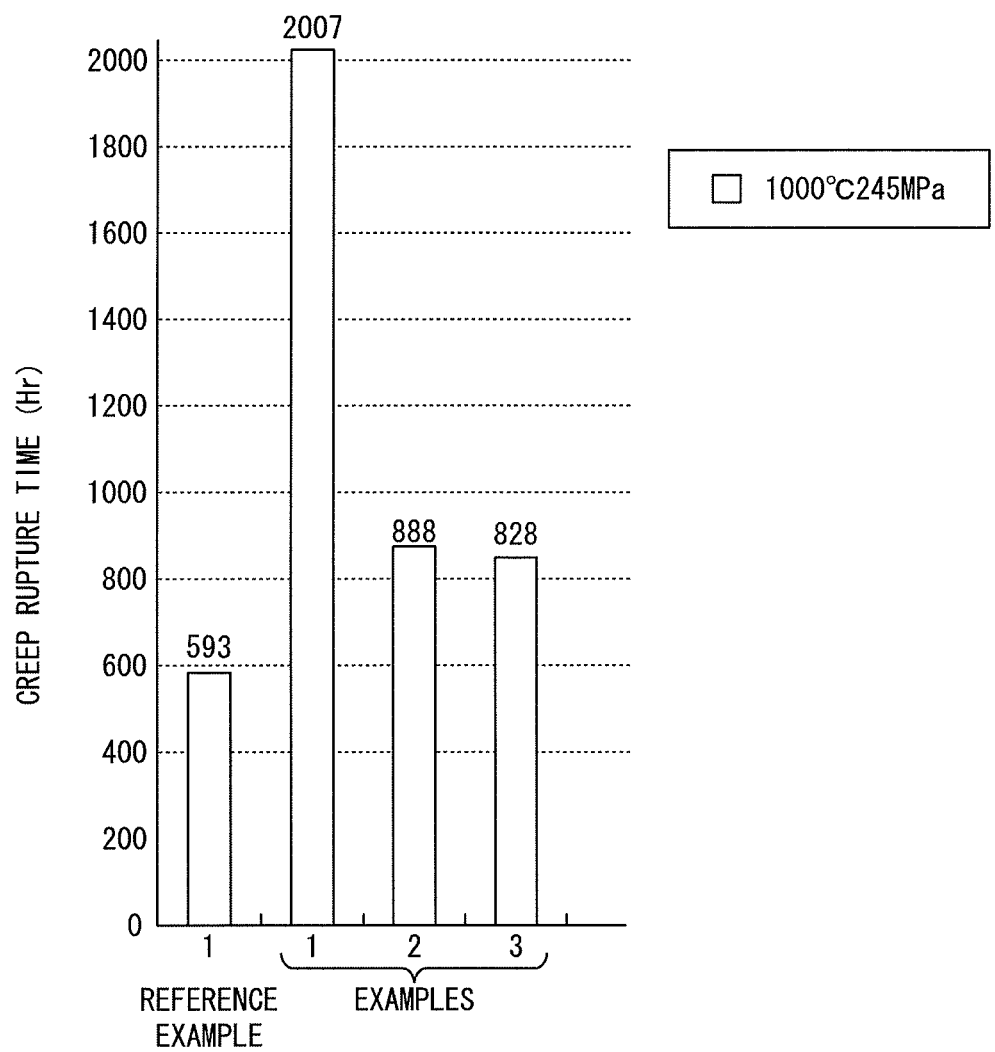
FIG. 3 is a graph showing a creep rupture time of examples and a reference example according to Patent Document 1 shown in Table 1.

As shown in FIG. 3, the Ni-based single crystal superalloys of Examples 1 to 3 have longer creep rupture time as compared to the high-rhenium Ni-based single crystal superalloy of the Non-Patent Document 1 which is denoted as Reference Example 1 in FIG. 3.

Specifically, according to the comparison under the condition of the above-described creep test, creep rupture time of Examples 1 to 3 are 2007.7 (hrs), 888.4 (hrs) and 828.6 (hrs), respectively, and are longer than creep rupture time of the high-rhenium Ni-based single crystal superalloy (593 (hrs)).

In particular, creep rupture time of Example 1 is more than 3 times as long as that of the Reference Example 1, and shows extremely superior creep strength.

As described above, the Ni-based single crystal superalloy of the present invention has excellent specific creep strength even though it includes 8.0 wt % or more of Re.

Subsequently, the result of simulation performed to compare a relationship between content of Mo in the Ni-based single crystal superalloy of the present invention and creep life will be explained with reference to FIG. 4.

This simulation is performed by using a software "JMatPro V.5.0" developed by Sente Software Ltd. (UK). This software calculates values concerning thermodynamic physical properties and mechanical physical properties of metallic alloys, and it is demonstrated that the creep life of the Ni-based single crystal superalloy which is included in the technical field of the present invention can be accurately estimated as shown in FIG. 16 of the following document.

(Document: N. Saunders, Z. Guo, X. Li, A. P. Miodownik and J-Ph. Schille: MODELLING THE MATERIAL PROPERTIES AND BEHAVIOUR OF Ni-BASED SUPERALLOYS, Superalloys 2004, (TMS, 2004), pp. 849-858.)

Figure 4:
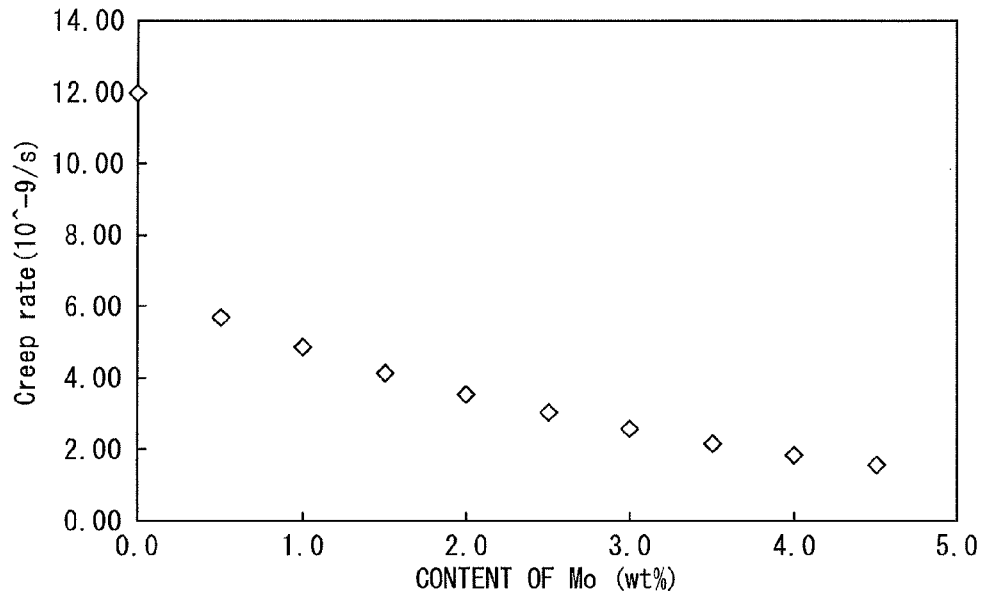
FIG. 4 is a graph obtained by simulation showing a relationship between content of Mo and creep speed in a Ni-based single crystal superalloy which includes average composition of examples of the present invention.

FIG. 4 is a graph obtained by simulation showing a relationship between content of Mo and stationary creep speed in a Ni-based single crystal superalloy, and an axis of abscissa denotes content of Mo and an axis of ordinate denotes stationary creep speed.

Composition of the alloy used for analysis is set to have an average composition of Examples 1 to 3 of the present invention and only the content of Mo is changed to 0.0 to 4.5 wt %, and content of Ni is regulated in accordance with a change of the content of Mo. In addition, a condition of analysis is set to 250° C. and 245 MPa on the assumption of an ordinary situation of a turbine blade in operation.

From FIG. 4, it is confirmed that the creep speed decreases in accordance with the increase of the content of Mo, in particular, when the content of Mo exceeds 2.0 wt % or so, it becomes to show an excellent creep characteristic (creep speed which is ⅓ or less of that of the alloy who does not include Mo).

On the other hand, when excessive Mo is added to the alloy, the above-described TCP phase is precipitated easier.

Figure 5:
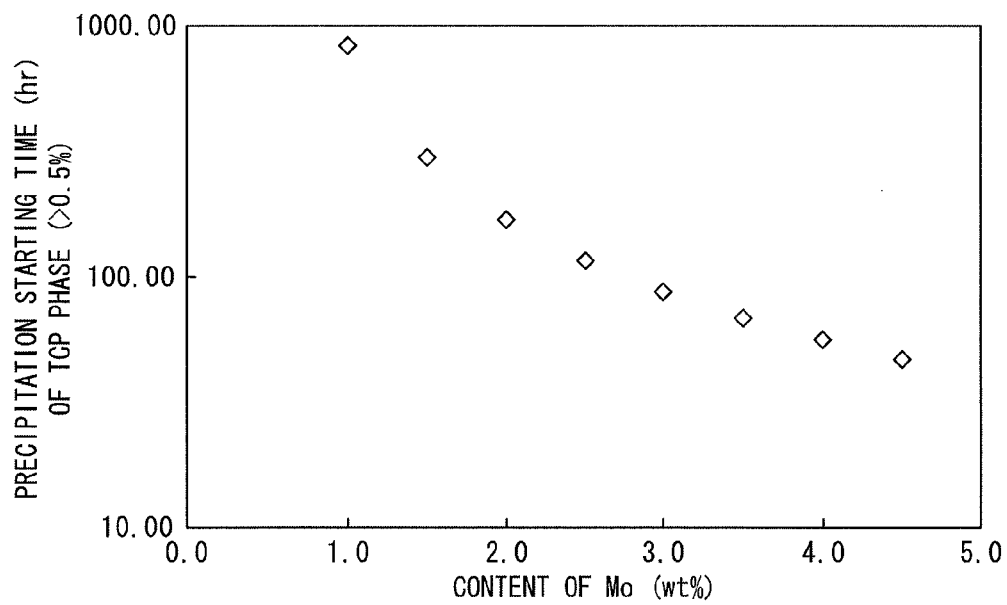
FIG. 5 is a graph obtained by simulation showing a relationship between content of Mo and precipitation starting time of TCP phase in a Ni-based single crystal superalloy which includes average composition of examples of the present invention.

FIG. 5 shows a relationship between content of Mo and precipitation starting time of TCP phase obtained by simulation.

Composition of an alloy used for analysis is same as that of the alloy used for the analysis of FIG. 4, and a temperature for analysis is set to 950° C.

From FIG. 5, it is confirmed that the precipitation starting time of TCP phase is shortened in accordance with the increase of the content of Mo, in particular, when the content of Mo exceeds 3.0 wt %, it becomes to fall below 100 hours, and when the content of Mo exceeds 3.5 wt %, it becomes to fall below 70 hours.

Accordingly, in order to reduce harmful influences caused by the precipitation of TCP phase while maintaining excellent creep strength, it is preferable that the content of Mo is controlled to 2.1 wt % or more to 3.4 wt % or less (more preferably 3.0 wt % or less).

While preferred embodiments of the present invention have been described with reference to figures, the present invention is not to be limited to the above embodiments.

Each of the features and combinations thereof disclosed in the above-described embodiments only shows one instance and can be changed based on design requirements within the spirit or scope of the present invention.

INDUSTRIAL APPLICABILITY

According to the present invention, the Ni-based single crystal superalloy which includes more than 8 wt % of Re in the composition ratio and has excellent specific creep strength may be provided. Therefore, the turbine blade incorporating the Ni-based single crystal superalloy which includes a large amount of Re and has excellent specific creep strength may be made lightweight and may be operated at higher temperatures.

DESCRIPTION OF THE REFERENCE SYMBOLS

1: turbine blade

The invention claimed is:

1. A Ni-based single crystal superalloy which has the following composition: Co: 0.0 wt % or more to 15.0 wt % or less, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 9.1 to 9.9 wt % and Ru: 0.5 to 6.5 wt % with the remainder including Ni and unavoidable impurities.

2. A turbine blade which incorporates the Ni-based single crystal superalloy according to claim 1.

3. A Ni-based single crystal superalloy according to claim 1, further comprising at least one element selected from a group consisting of B, C, Si, Y, La, Ce, V and Zr, and wherein the selected components are contained in the following composition: B: 0.05 wt % or less, C: 0.15 wt % or less, Si: 0.1 wt % or less, Y: 0.1 wt % or less, La: 0.1 wt % or less, Ce: 0.1 wt % or less, V: 1 wt % or less and Zr: 0.1 wt % or less.

4. A turbine blade which incorporates the Ni-based single crystal superalloy according to claim 3.

5. A Ni-based single crystal superalloy which has the following composition: Co: 0.0 to 15.0 wt %, Cr: 5.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 9.1 to 9.9 wt % and Ru: 0.5 to 6.5 wt % with the remainder including Ni and unavoidable impurities.

6. A Ni-based single crystal superalloy which has the following composition: Co: 4.0 to 9.5 wt %, Cr: 4.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 9.1 to 9.9 wt % and Ru: 0.5 to 6.5 wt % with the remainder including Ni and unavoidable impurities.

7. A Ni-based single crystal superalloy which has the following composition: Co: 4.0 to 9.5 wt %, Cr: 5.1 to 8.0 wt %, Mo: 2.1 to 4.5 wt %, W: 0.0 to 3.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 9.1 to 9.9 wt % and Ru: 0.5 to 6.5 wt % with the remainder including Ni and unavoidable impurities.

8. A Ni-based single crystal superalloy which has the following composition: Co: 0.0 to 15.0 wt %, Cr: 4.1 to 8.0 wt %, Mo: 2.1 to 4.5 wt %, W: 0.0 to 2.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 9.1 to 9.9 wt % and Ru: 0.5 to 6.5 wt % with the remainder including Ni and unavoidable impurities.

9. A Ni-based single crystal superalloy which has the following composition: Co: 0.0 to 15.0 wt %, Cr: 4.1 to 8.0 wt %, Mo: 2.1 to 4.5 wt %, W: 0.0 to 1.9 wt %, Ta: 4.0 to 10.0 wt %, Al: 4.5 to 6.5 wt %, Ti: 0.0 to 1.0 wt %, Hf: 0.00 to 0.5 wt %, Nb: 0.0 to 3.0 wt %, Re: 9.1 to 9.9 wt % and Ru: 0.5 to 6.5 wt % with the remainder including Ni and unavoidable impurities.

10. A Ni-based single crystal superalloy which has the following composition: Co: 4.0 to 9.5 wt %, Cr: 5.1 to 8.0 wt %, Mo: 2.1 to 4.5 wt %, W: 0.0 to 1.9 wt %, Ta: 4.0 to 6.5 wt %, Al: 4.5 to 6.5 wt %, Ti: 0.0 to 0.5 wt %, Hf: 0.00 to 0.5 wt %, Nb: 0.0 to 1.0 wt %, Re: 9.1 to 9.9 wt % and Ru: 4.0 to 6.5 wt % with the remainder including Ni and unavoidable impurities.

11. A Ni-based single crystal superalloy which has the following composition: Co: 4.0 to 9.5 wt %, Cr: 5.1 to 6.5 wt %, Mo: 2.1 to 4.0 wt %, W: 0.0 to 1.9 wt %, Ta: 4.0 to 6.0 wt %, Al: 5.0 to 6.0 wt %, Ti: 0.0 to 0.5 wt %, Hf: 0.00 to 0.5 wt %, Nb: 0.0 to 1.0 wt %, Re: 8.1 to 9.0 wt % of Re and Ru: 4.0 to 6.5 wt % with the remainder including Ni and unavoidable impurities.

* * * * *